(12) United States Patent
Miyata

(10) Patent No.: US 8,384,809 B2
(45) Date of Patent: Feb. 26, 2013

(54) SOLID-STATE IMAGING DEVICE AND METHOD OF MANUFACTURING THE SAME, AND IMAGING APPARATUS

(75) Inventor: Satoe Miyata, Tokyo (JP)

(73) Assignee: Sony Corporation, Tokyo (JP)

( * ) Notice: Subject to any disclaimer, the term of this patent is extended or adjusted under 35 U.S.C. 154(b) by 588 days.

(21) Appl. No.: 12/581,583

(22) Filed: Oct. 19, 2009

(65) Prior Publication Data

US 2010/0103299 A1    Apr. 29, 2010

(30) Foreign Application Priority Data

Oct. 23, 2008  (JP) ................................. 2008-272673

(51) Int. Cl.
*H04N 5/335* (2006.01)
*H01L 31/18* (2006.01)

(52) U.S. Cl. .......................................... 348/294; 438/69
(58) Field of Classification Search .................... None
See application file for complete search history.

(56) References Cited

U.S. PATENT DOCUMENTS

| | | | | |
|---|---|---|---|---|
| 5,844,290 | A * | 12/1998 | Furumiya | 257/432 |
| 6,620,996 | B2 * | 9/2003 | Sugawara et al. | 136/250 |
| 7,365,380 | B2 * | 4/2008 | Yuzurihara et al. | 257/292 |
| 7,391,455 | B2 * | 6/2008 | Oda | 348/314 |

FOREIGN PATENT DOCUMENTS

| | | |
|---|---|---|
| JP | 06-077522 | 3/1994 |
| JP | 09-064328 | 3/1997 |
| JP | 2000-228513 | 8/2000 |
| JP | 2002-170945 | 6/2002 |
| JP | 2005-209810 | 8/2005 |
| JP | 2005-223084 | 8/2005 |
| JP | 2005-310826 | 11/2005 |
| JP | 2005-332925 | 12/2005 |
| JP | 2007-134562 | 5/2007 |
| JP | 2008-066742 | 3/2008 |
| JP | 2008-218670 | 9/2008 |

* cited by examiner

*Primary Examiner* — Luong T Nguyen
(74) *Attorney, Agent, or Firm* — Robert J. Depke; The Chicago Technology Law Group, LLC.

(57) ABSTRACT

A solid-state imaging device includes: a semiconductor substrate; and a plurality of pixels arrayed two-dimensionally in the semiconductor substrate, each of the pixels having a photoelectric conversion element that performs photoelectric conversion, the photoelectric conversion element having a first impurity region, formed in the semiconductor substrate, containing an impurity of a first conductivity type; a second impurity region formed in the semiconductor substrate so as to be in contact with the first impurity region, containing an impurity of a second conductivity type different from the first conductivity type; and a PN junction portion in which the first impurity region and the second impurity region are in contact with each other, formed in a protruding shape projecting toward a surface side of the semiconductor substrate.

13 Claims, 15 Drawing Sheets

SOLID-STATE IMAGING DEVICE AND METHOD OF MANUFACTURING THE SAME, AND IMAGING APPARATUS

BACKGROUND OF THE INVENTION

1. Field of the Invention

The present invention relates to a solid-state imaging device, a method of manufacturing the solid-state imaging apparatus, and an imaging apparatus. More particularly, the invention relates to a solid-state imaging device having a photoelectric conversion element, a method of manufacturing the solid-state imaging device, and an imaging apparatus equipped with the solid-state imaging device.

2. Description of Related Art

Developments of cameras for image input that are used with personal computers have been carried out increasingly in recent years. Solid-state imaging devices that are incorporated in such cameras employ CCD image sensors, which use charge coupled devices (CCD), and CMOS image sensors, whose manufacturing process is compatible with CMOS manufacturing processes.

A CCD image sensor is an image sensor in which photoelectric conversion elements (photodiodes) corresponding to pixels are arrayed two-dimensionally and respective pixel signals turned into electric charge by the photoelectric conversion elements are read sequentially using vertical transfer CCDs and horizontal transfer CCDs. A CMOS image sensor is similar to the CCD image sensor in the point that photoelectric conversion elements corresponding to pixels are arrayed two-dimensionally. However, the CMOS image sensor does not use vertical and horizontal transfer CCDs for signal reading, but it reads respective signals stored in respective pixels from selected pixels by select lines made of aluminum or copper wiring lines, like a memory device. Although the CCD image sensor and the CMOS image sensor are different in reading systems for pixel signals and so forth, their photodiodes, serving as photoelectric conversion elements, have a common structure.

An example of known structure of the photodiode is shown in FIG. 16 (see JP-A-2002-170945). FIG. 16 shows a state in which a photodiode 103 is formed between element-isolating regions 102 formed on a surface layer portion of a silicon substrate 101. The photodiode 103 has a structure in which impurity regions, namely, a P+ region 104, an N+ region 105, an N− region 106, and a P− region 107, are formed in that order from the surface of the silicon substrate 101 in a depth direction. The symbols "+" and "−" in the figure indicate that a case where the impurity concentration is "higher" than other regions and a case in which the impurity concentration is "lower" than other regions, respectively.

Such a structure makes it possible to reduce dark current produced from the surface of the silicon substrate 101 of the photodiode 103. Electron-hole pairs are generated by the light entering the region of the photodiode 103, and signal charges (electrons) are stored in the junction portion of the P region and the N region. The maximum value of the signal charge that can be stored in the PN junction portion is referred to as a saturated signal charge amount (hereinafter also denoted as "Qs"). An image sensor with high Qs is excellent in various characteristics such as dynamic range and SN (signal/noise) ratio. Accordingly, increasing of Qs is a very important factor in achieving improvements in the characteristics of the image sensor.

SUMMARY OF THE INVENTION

Conceivable methods for increasing the saturated signal charge amount (Qs) include increasing of the PN junction area of the photodiode and increasing of the PN junction capacitance of the photodiode. However, if the area of the photodiode is two-dimensionally enlarged for the purpose of increasing the PN junction area of the photodiode, the total number of pixels in the image sensor decreases corresponding to the enlargement of the area of the photodiode, compared to the one with the same field of view (for example, ⅔ inches). On the other hand, if the impurity concentrations of the P region and the N region are increased for the purpose of increasing the PN junction capacitance of the photodiode, deterioration in the characteristics, such as an increase in dark current, will be caused. Thus, there is a limit to the increasing of the PN junction capacitance by increasing the impurity concentration.

Accordingly, it is desirable if the saturated signal charge amount can be increased without enlarging the area of the photoelectric conversion element two-dimensionally or increasing the impurity concentration.

A solid-state imaging device according to an embodiment of the invention includes a semiconductor substrate, and a plurality of pixels arrayed two-dimensionally in the semiconductor substrate. Each of the pixels has a photoelectric conversion element that performs photoelectric conversion. The photoelectric conversion element has: a first impurity region, formed in the semiconductor substrate, containing an impurity of a first conductivity type; a second impurity region, formed in the semiconductor substrate so as to be in contact with the first impurity region, containing an impurity of a second conductivity type different from the first conductivity type; and a PN junction portion in which the first impurity region and the second impurity region are in contact with each other, formed in a protruding shape projecting toward a surface side of the semiconductor substrate. An imaging apparatus according to an embodiment of the invention includes a solid-state imaging device having the above-described configuration, and an optical system configured to guide light from a subject to the solid-state imaging device.

In the solid-state imaging device and the imaging apparatus according to the embodiments of the invention, the PN junction portion at which the first impurity region and the second impurity region are in contact is formed in a protruding shape projecting toward the surface side of the semiconductor substrate. Thereby, the area of the PN junction portion extends not only in a substrate surface direction but also in a substrate depth direction because of the three-dimensional slope of the protruding shape.

According to the embodiments of the invention, the PN junction portion at which the first impurity region and the second impurity region are in contact is formed in a protruding shape projecting toward the surface side of the semiconductor substrate. Thereby, the area of the PN junction portion can be extended not only in a substrate surface direction but also in a substrate depth direction because of the three-dimensional slope of the protruding shape. As a result, the saturated signal charge amount can be increased without enlarging the area of the photoelectric conversion element two-dimensionally or increasing the impurity concentration.

DESCRIPTION OF PREFERRED
EMBODIMENTS OF THE INVENTION

Hereinbelow, specific embodiments of the invention will be described in detail with reference to the drawings. It should be understood that the technological scope of the invention is not limited to the embodiments described below but includes various changes and modifications as long as those changes and modifications are within the scope in which the specific advantageous effects can be obtained by the elements of the invention and combinations thereof.

The description of preferred embodiments of the invention (hereinafter also simply the embodiments) will be given in accordance with the following order. Herein, a charge-transfer type solid-state imaging device that is made of a CCD image sensor (hereinafter referred to as a "CCD solid-state imaging device") is taken as an example. However, the invention is also applicable to an X-Y address-type solid-state imaging device such as represented by a CMOS image sensor.

Figure 1:
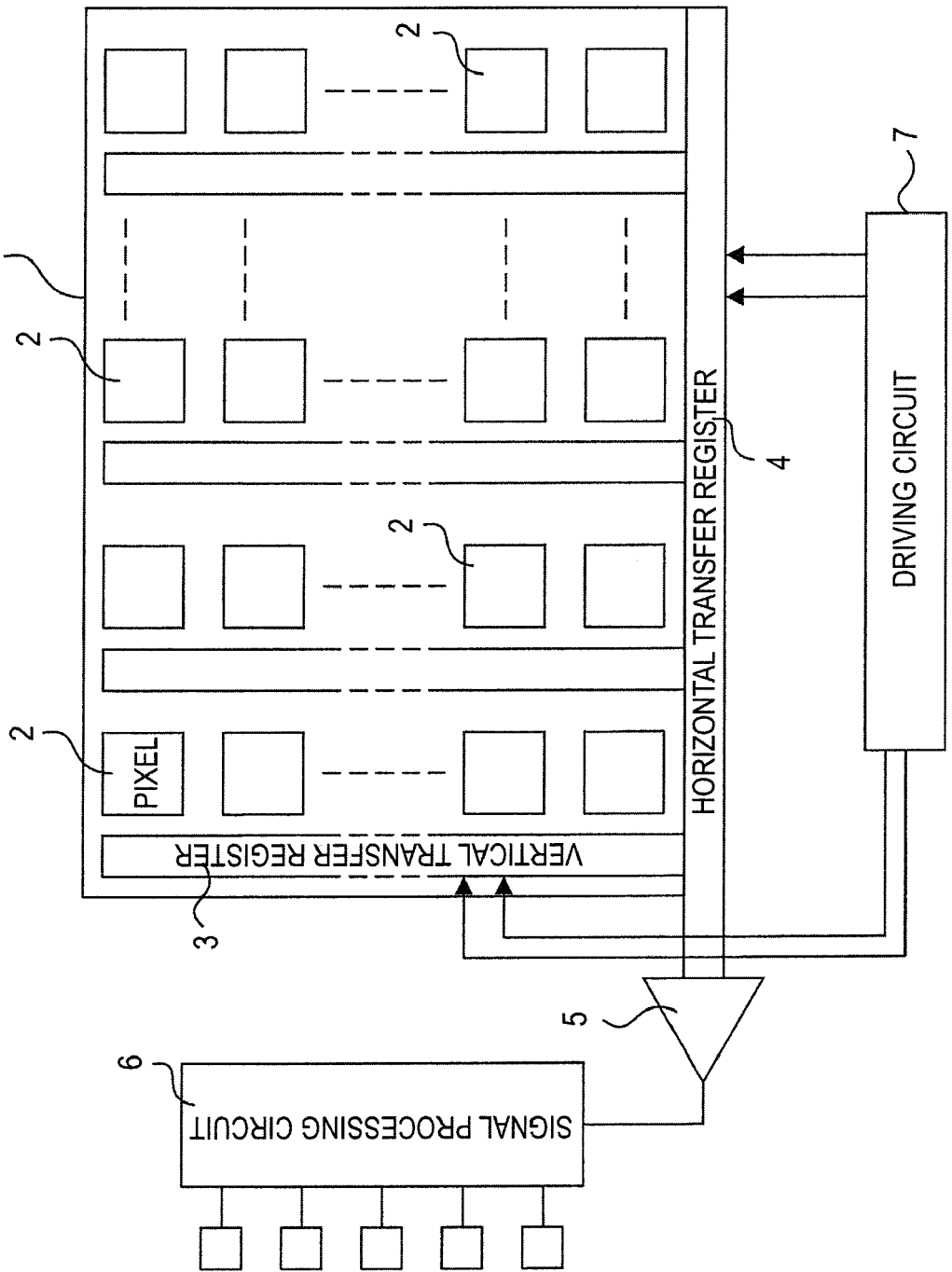
FIG. 1 is a schematic view showing an example of the configuration of a CCD solid-state imaging device to which the invention is applied.

1. Configuration of the solid-state imaging device
2. First Embodiment
3. Second Embodiment
4. Application example 1. Configuration of the Solid-State Imaging Device FIG. 1 is a schematic view showing an example of the configuration of a CCD solid-state imaging device to which the invention is applied. As shown in the figure, in a pixel array 1, a plurality of (a multiplicity of) pixels 2 are arrayed two-dimensionally (in an array form). These plurality of pixels 2 are arrayed two-dimensionally in the substrate surface of a later-described semiconductor substrate. Each of the pixels 2 has a photoelectric conversion element for performing photoelectric conversion and pixel transistors for reading a signal charge from the photoelectric conversion element. More specifically, the photoelectric conversion element converts incident light into a signal charge corresponding to the amount of the light received and accumulates the signal charge. The pixel transistors are constituted by a plurality of transistors. The pixel transistors include a charge transfer transistor having a transfer gate. The transistors other than the charge transfer transistor include, for example, a reset transistor, an amplifier transistor, and a select transistor. Each of the pixels 2 provided in the pixel array 1 performs photoelectric conversion on the light entering therein through a color filter corresponding to each of the pixels.

In the pixel array 1, a plurality of vertical transfer registers 3 are provided for the pixels 2 along a vertical direction. Each of the vertical transfer registers 3 is provided adjacent to the pixels 2 for each pixel column. The vertical transfer registers 3 are for transferring the signal charge read by each column of the pixels 2 in a vertical direction, and they are made of a vertical CCD.

A horizontal transfer register 4 is provided at a terminal portion of each of the vertical transfer registers 3 along a horizontal direction. The horizontal transfer register 4 is for transferring the signal charge transferred in a vertical direction by each of the vertical transfer registers 3 in a horizontal direction, and it is made of a horizontal CCD. An output amplifier 5 is provided at a transfer destination of the signal charge transferred by the horizontal transfer register 4.

The output amplifier 5 converts the signal charge transferred in a horizontal direction by the horizontal transfer register 4 into a voltage and outputs the voltage. A signal that is output from the output amplifier 5 is input into a signal processing circuit 6. The signal processing circuit 6 receives the signal that is output from the output amplifier 5 and generates an image signal by performing predetermined signal processing. A driving circuit 7 generates a transfer pulse for transferring a signal charge and drives the vertical transfer registers 3 and the horizontal transfer register 4 according to the transfer pulse. At that time, the driving circuit 7 supplies a vertical transfer pulse to the vertical transfer registers 3 and supplies a horizontal transfer pulse to the horizontal transfer register 4.

2. First Embodiment

[Configuration of the Solid-State Imaging Device]

Figure 2:
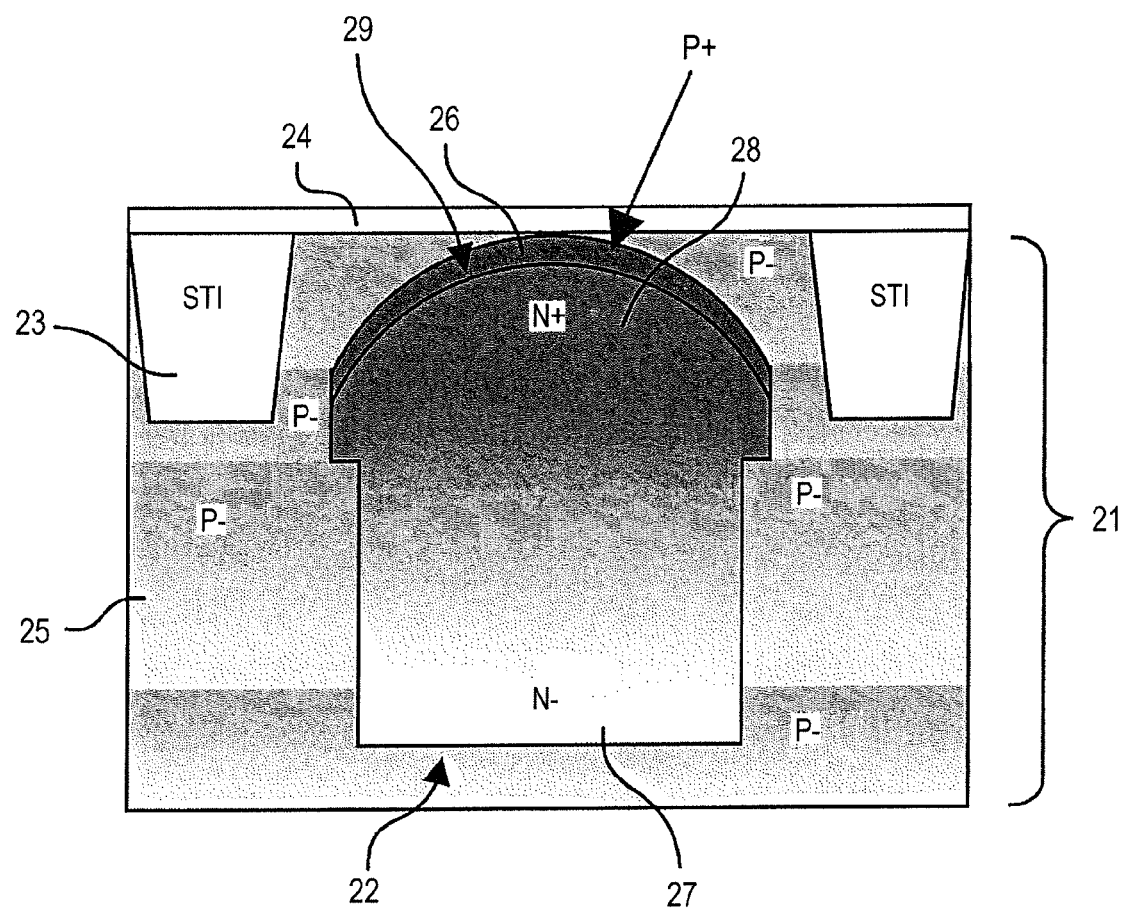
FIG. 2 is a cross-sectional view showing an example of the configuration of a solid-state imaging device according to a first embodiment of the invention.

FIG. 2 is a cross-sectional view showing an example of the configuration of a solid-state imaging device according to a first embodiment of the invention. Referring to FIG. 2, a photodiode 22 that serves as a photoelectric conversion element is formed in a semiconductor substrate 21. In the case of solid-state imaging devices having color filters of R (red), G (green), and B (blue), the photodiode 22 may be formed in different shapes or depth positions corresponding to different color components of the filters. The semiconductor substrate 21 is partitioned into a plurality of unit pixel regions by STI (Shallow Trench Isolation) type element-isolating regions 23. The figure shows one of the unit pixel regions. The surface of the semiconductor substrate 21 is covered by an insulating film 24 made of, for example, silicon oxide. The insulating film 24 also functions as a gate insulating film for the pixel transistors.

The semiconductor substrate 21 is made of a first conductivity type semiconductor substrate, for example, a P-type silicon substrate. In the semiconductor substrate 21, a P– region 25, a P+ region 26, an N– region 27, and an N+ region 28 are formed as impurity diffusion regions. These impurity regions 25 to 28 are formed at necessary depths respectively from the surface of the semiconductor substrate 21.

Both the P– region 25 and the P+ region 26 are formed by introducing an impurity of P-type, which is the first conductivity type, into the substrate. The P– region 25 corresponds to a low-concentration impurity region in which the concentration of the P-type impurity is relatively low, while the P+ region 26 corresponds to a high-concentration impurity region in which the concentration of the P-type impurity is relatively high. On the other hand, both the N– region 27 and the N+ region 28 are formed by introducing an impurity of N-type, which is the second conductivity type, into the substrate. The N– region 27 corresponds to a low-concentration impurity region in which the concentration of the N-type impurity is relatively low, while the N+ region 28 corresponds to a high-concentration impurity region in which the concentration of the N-type impurity is relatively high. For one example, the impurity concentrations of the P– region 25 and the N– region 27 are equal to or higher than $1\times10^{15}$ (atoms/cm$^3$) and less than $1\times10^{17}$ (atoms/cm$^3$). The impurity concentrations of the P+ region 26 and the N+ region 28 are equal to or higher than $1\times10^{17}$ (atoms/cm$^3$) and less than $1\times10^{18}$ (atoms/cm$^3$).

The N-type impurity regions including the N– region 27 and the N+ region 28 are formed in the semiconductor substrate 21 so as to be surrounded by the P-type impurity regions including the P– region 25 and the P+ region 26. More specifically, the P– region 25 exists on both sides of the N-type impurity regions including the N– region 27 and the N+ region 28. The P– region 25 exists below the N– region 27, and the P+ region 26 exists above the N+ region 28.

The N– region 27 and the N+ region 28 are formed in such a manner that the gradient of the impurity concentration is formed in a depth direction of the semiconductor substrate 21. The one that is farther from the substrate surface (the one that is deeper) is the N– region 27, while the one that is closer to the substrate surface (the one that is shallower) is the N+ region 28. Thus, the N– region 27 exists below the N+ region 28.

The P-type impurity regions (25, 26) and the N-type impurity regions (27, 28) are formed in the semiconductor substrate 21 in such a condition as to be in contact with each other. The portion at which the P-type impurity regions (25, 26) and the N-type impurity regions (27, 28) are in contact is a PN junction portion, and the photodiode 22 is formed by the PN junction. The photodiode 22 primarily contains the P+ region 26, the N– region 27, and the N+ region 28. A portion 29 of the PN junction portion is formed in a protruding shape projecting toward the surface side of the semiconductor substrate 21. Of the two surfaces (the obverse surface and the reverse surface) of the semiconductor substrate 21, the surface side of the semiconductor substrate 21 refers to the side on which the pixel transistors (not shown) are formed. Here, the PN junction portion 29 is formed in a protruding shape projecting toward the side on which light enters the photodiode 22. That is, the surface side of the semiconductor substrate 21 corresponds to the light entering side. The PN junction portion 29 in the protruding shape is formed by the P+ region 26, which is a P-type high-concentration impurity region, and the N+ region 28, which is an N-type high-concentration impurity region. Accordingly, the PN junction portion 29 is a portion in which the high-concentration impurity regions (26, 28) are in contact with each other. The PN junction portion 29 is formed in a hemisphere protruding shape (a hemispherical shape overall).

[Method of Manufacturing the Solid-State Imaging Device]

Figure 3A:
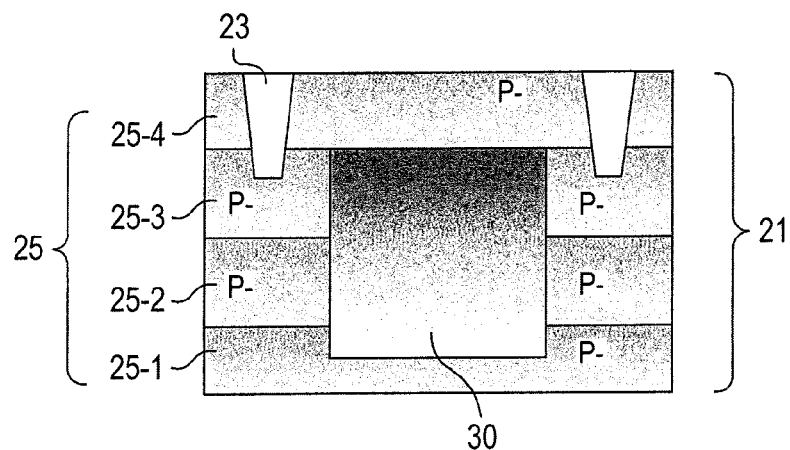
FIGS. 3A to 3C are views (no. 1) for illustrating a manufacturing method of a solid-state imaging device according to the first embodiment of the invention.

FIGS. 3A to 3C through FIGS. 6A to 6C are views for illustrating a manufacturing method of the solid-state imaging device according to the first embodiment of the invention. First, as shown in FIG. 3A, an N-type impurity region 30 is formed within a pixel region of the semiconductor substrate 21 made of a silicon substrate and at a necessary depth position within the substrate by an ion implantation technique. Next, the P– regions 25 (25-1, 25-2, 25-3, 25-4) are formed within the semiconductor substrate 21 by an ion implantation technique so as to surround the N-type impurity region 30. Thereafter, the STI-type element-isolating regions 23 are formed on the semiconductor substrate 21. It should be noted that either of the formation step of the impurity regions or the formation step of the element-isolating regions 23 by an ion implantation technique may be carried out first.

In forming the P– region 25, the ion implantation is carried out plural times while the acceleration energy at the time of the ion implantation is changed in order, whereby a plurality of layers (four layers in the figure) of the P– regions 25 are formed at respective positions with desired depths from the substrate surface. For example, when using B (boron) as the ion species, the P– regions 25 are formed by a first ion implantation step, a second ion implantation step, a third ion implantation step, and a fourth ion implantation step as follows.

First ion implantation step (step of forming the P– region 25-1):

Implantation energy=1000 to 1500 keV, Dosage=1 to 3E12

Second ion implantation step (step of forming the P– region 25-2):

Implantation energy=600 to 1000 keV, Dosage=1 to 3E12

Third ion implantation step (step of forming the P– region 25-3):

Implantation energy=300 to 600 keV, Dosage=1 to 5E12

Fourth ion implantation step (step of forming the P– region 25-4):

Implantation energy=100 to 300 keV, Dosage=1 to 5E12

Figure 3B:
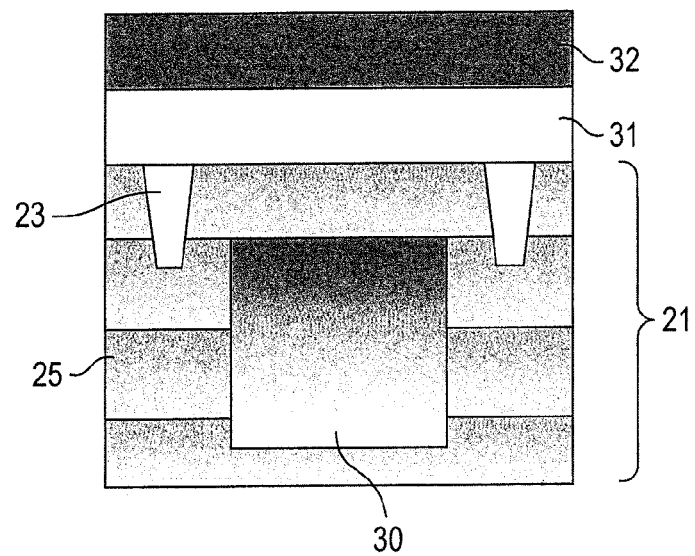

Next, as shown in FIG. 3B, an oxide film 31 is formed on the semiconductor substrate 21 by a CVD technique or a thermal oxidation technique. The oxide film 31 is, for example, silicon oxide. The oxide film 31 is formed in such a condition as to cover the surface of the semiconductor substrate 21 (the entire surface). The film thickness of the oxide film 31 is, for example, 50 to 200 nm. Next, a photoresist film 32 is formed on the oxide film 31. The film thickness of the photoresist film 32 is, for example, 50 to 500 nm.

Figure 3C:
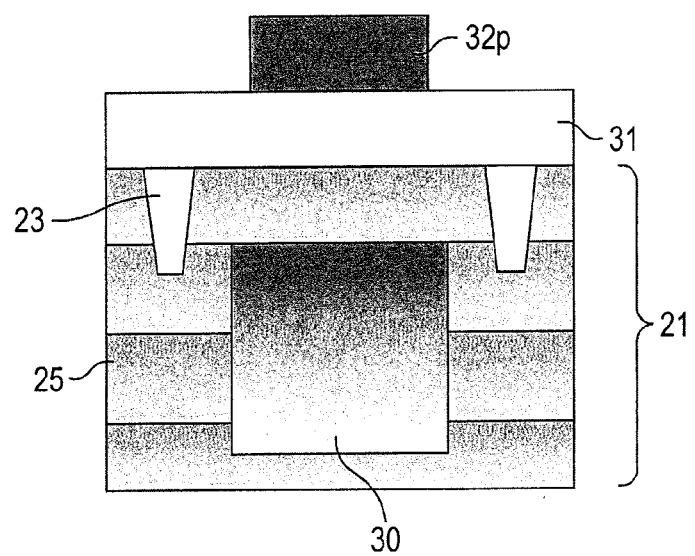

Next, as shown in FIG. 3C, the photoresist film 32 is patterned by a photolithography technique so that the resist remains only in a desired region in which the photodiode region is formed. This results in a condition in which a resist pattern 32p exists directly above the N-type impurity region 30 and the oxide film 31 is covered by the resist pattern 32p.

Figure 4A:
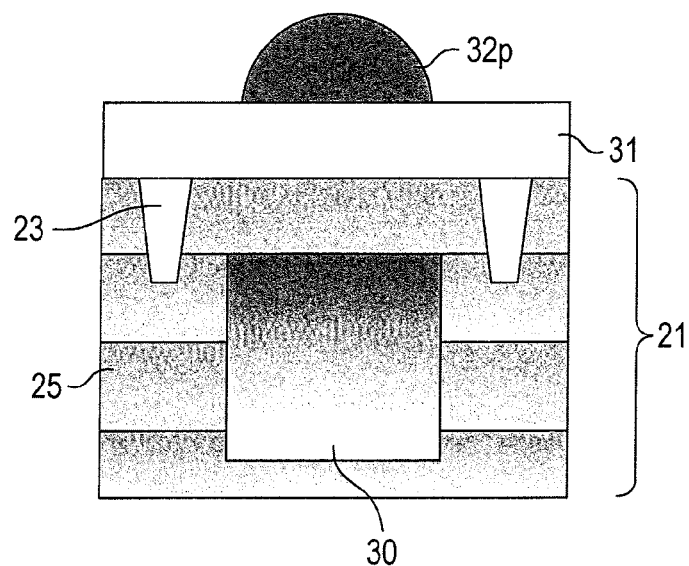
FIGS. 4A to 4C are views (no. 2) for illustrating the manufacturing method of a solid-state imaging device according to the first embodiment of the invention.

Next, as shown in FIG. 4A, the resist pattern 32p is thermally deformed by a thermal flow process. Thereby, the resist pattern 32p deformed in a hemisphere shape (a substantially hemispherical shape overall) can be obtained. The specific technique or process conditions of the thermal flow process may be selected as appropriate depending on the material, thickness, shape, and the like of the resist pattern 32p. For example, the process conditions of the thermal flow process may be set as follows. The temperature range during heating is set to be about 130 to 140° C., and the heating time is set at about 90 seconds. Examples of the method for the heat treatment include a heat treatment by furnace annealing, a heat treatment by RTA (Rapid Thermal Annealing), a heat treatment by electron beam, and a heat treatment using a hot plate. Besides these methods, any method other than the thermal flow process (for example, a microlens formation process) may be employed as long as the method is capable of deforming the resist pattern 32p into a hemisphere shape.

Figure 4B:
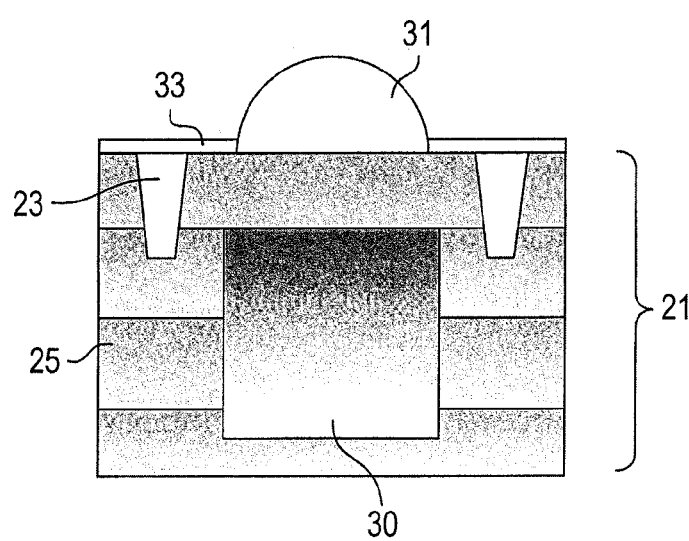

Next, as shown in FIG. 4B, using the resist pattern 32p deformed in the above-described manner as a mask, the oxide film 31 is etched by an anisotropic dry etching technique. At this time, the oxide film 31 and the resist pattern 32p are etched simultaneously. As a result, at the stage where the resist pattern 32p is completely removed by etching, a portion of the oxide film 31 remains in an upwardly protruding shape such that the shape of the resist pattern 32p is transferred thereto. At this time, the direction in which the oxide film 31 protrudes is a direction away from the surface of the semiconductor substrate 21. In addition, the oxide film 31 in a hemisphere shape exists directly above the N-type impurity region 30. Thereafter, an oxide film 33 is formed over the surface (entire surface) of the semiconductor substrate 21 by a CVD technique or a thermal oxidation technique. The oxide film 33 is formed to have a film thickness of about 10 nm, for example. It should be noted that when the oxide film 33 is formed by a CVD technique, the protruding face of the oxide film 31 is covered by the oxide film 33.

Figure 4C:
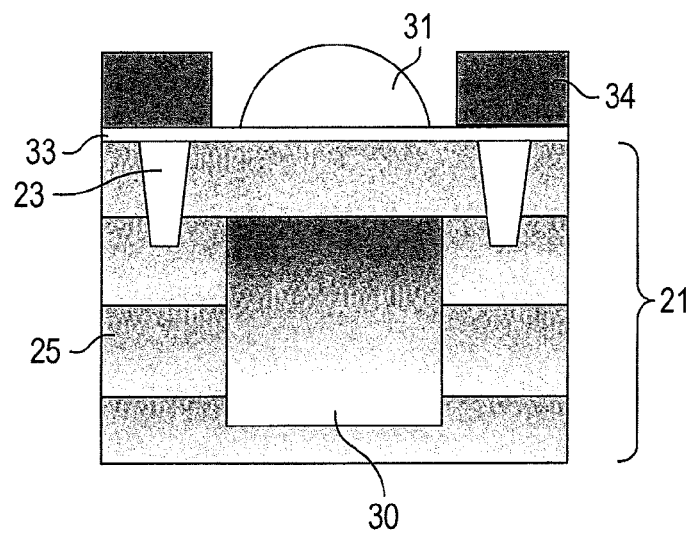

Next, as shown in FIG. 4C, a photoresist film 34 is formed on the oxide film 33 of the semiconductor substrate 21 again, and thereafter, the photoresist film 34 is patterned so that a region in which the N+ region 28 is to be formed is opened in the area in which the oxide film 31 exists.

Figure 5A:
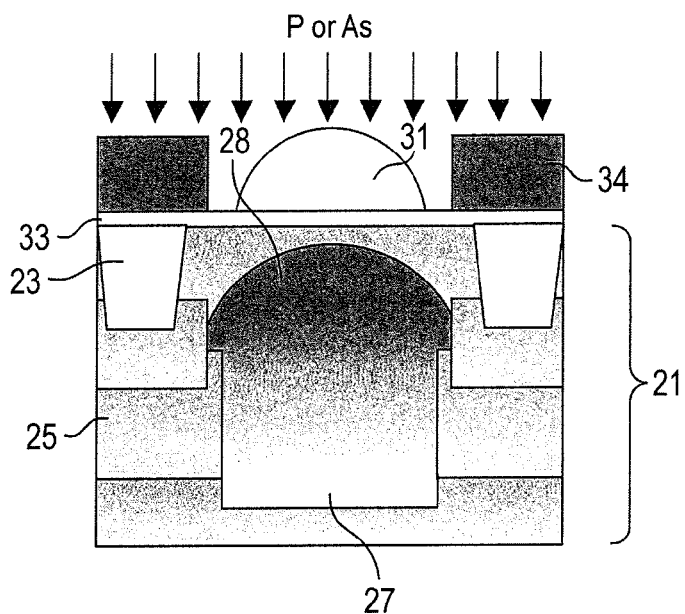
FIGS. 5A to 5C are views (no. 3) for illustrating the manufacturing method of a solid-state imaging device according to the first embodiment of the invention.

Next, as shown in FIG. 5A, using the oxide film 31 and the photoresist film 34 as a mask, N-type impurity atoms such as represented by P (phosphorus) and As (arsenic) are implanted (introduced) into the silicon of the semiconductor substrate 21 by an ion implantation technique. The ion implantation is carried out at an implantation energy of from 700 to 800 keV and a dosage of 1 to 2E12 in the case where P (phosphorus) is used as the ion species, for example. As a result, N-type impurity regions including the N− region 27 and the N+ region 28 are formed inside the semiconductor substrate 21. At this time, the N+ region 28 is formed below the oxide film 31 in such a form that the shape of the oxide film 31 is reflected. The reason is that the implantation depths of the N-type impurity atoms ion-implanted through the oxide film 31 are dependent on the thicknesses of the oxide film 31 that follow the protruding shape. Accordingly, the N+ region 28 is formed into a protruding shape projecting toward the surface side of the semiconductor substrate 21.

Figure 5B:
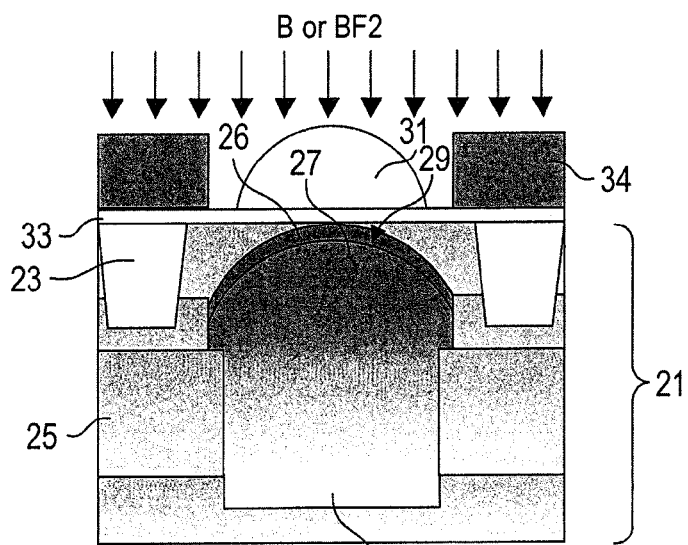

Next, as shown in FIG. 5B, using the oxide film 31 and the photoresist film 34 as a mask, P-type impurity atoms such as represented by B (boron) and BF$_2$ are implanted (introduced) into the silicon of the semiconductor substrate 21 by an ion implantation technique. The ion implantation is carried out at an implantation energy of 200 keV and a dosage of 1 to 2E12 in the case where B (boron) is used as the ion species, for example. As a result, the P+ region 26 is formed inside the semiconductor substrate 21. At this time, the P+ region 26 is formed below the oxide film 31 in such a form that the shape of the oxide film 31 is reflected, for the same reason as stated above. Accordingly, the P+ region 26 is formed into a protruding shape projecting toward the surface side of the semiconductor substrate 21, like the N+ region 28. The P+ region 26 is formed in a layer above the N+ region 28 in such a condition that it is in contact with the N+ region 28. The junction portion therebetween is formed as the PN junction portion 29 in a protruding shape.

It should be noted that either one of the N+ region 28 and the P+ region 26 may be formed first. The N-type impurity atoms are not limited to P and As, but may be other impurity atoms. Likewise, the P-type impurity atoms are not limited to B and BF$_2$, but may be other impurity atoms. However, as for the acceleration energy in the ion implantation, it is necessary to join the P+ region 26 and the N+ region 28, the P+ region 26 being an upper layer and the N+ region 28 being a lower layer. Therefore, it is desirable that the acceleration energy should be set at an energy level such that the difference between the implantation depth of the P-type impurity atoms and the implantation depth of the N-type impurity atoms becomes from about 0 nm to about 50 nm, for example.

Figure 5C:
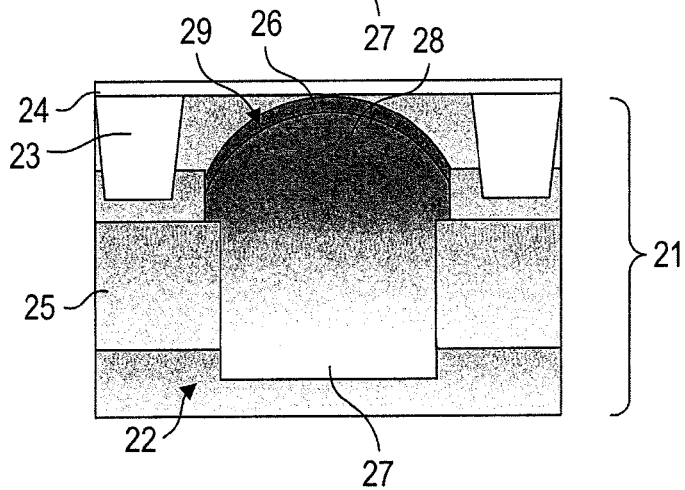

Next, as shown in FIG. 5C, the oxide film 31 and the photoresist film 34 are removed by, for example, wet etching. At this time, the oxide film 33 covering the surface of the semiconductor substrate 21 is also removed. Thereafter, the insulating film 24 is formed over the surface (entire surface) of the semiconductor substrate 21 by a thermal oxidation technique.

Figure 6A:
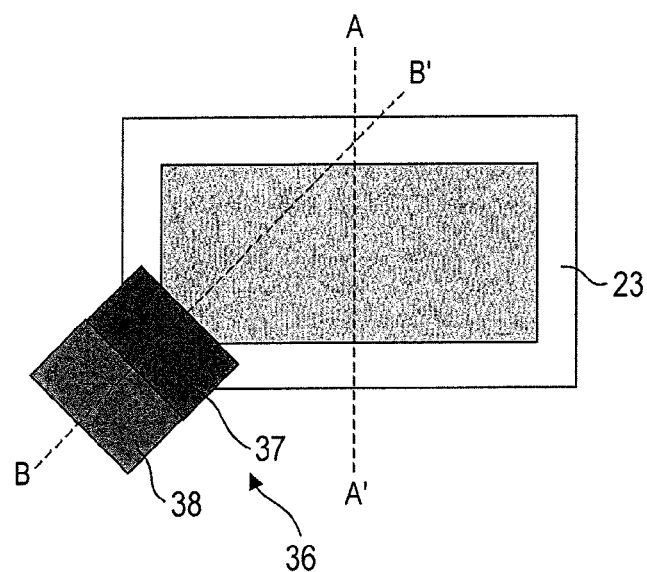
FIGS. 6A to 6C are views (no. 4) for illustrating the manufacturing method of a solid-state imaging device according to the first embodiment of the invention.
Figure 6B:
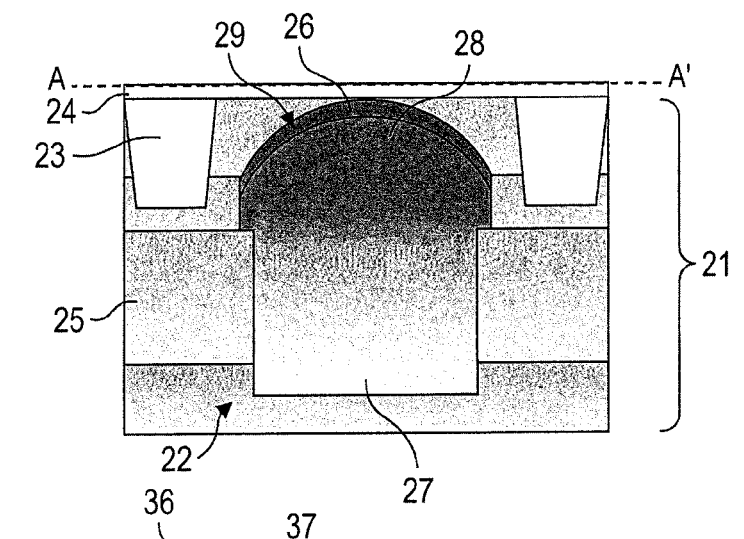
Figure 6C:
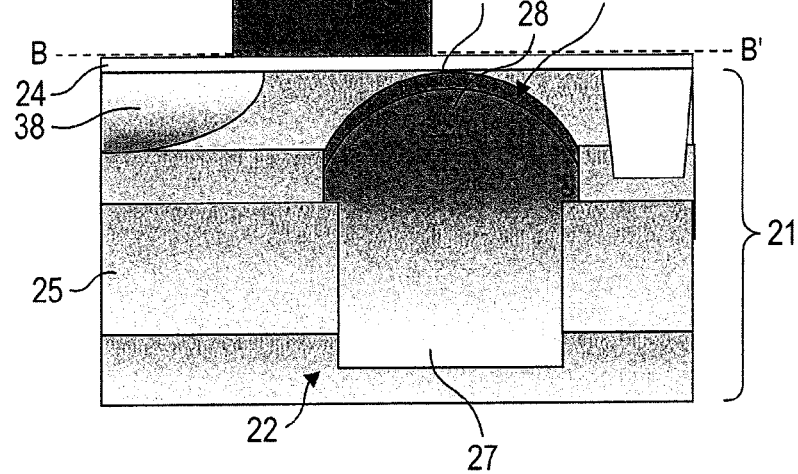

Next, as shown in FIGS. 6A, 6B, and 6C, a transfer gate 37 and a source/drain region 38 that constitute a charge transfer transistor 36 are formed. The source/drain region 38 is formed as an N-type impurity region by introducing N-type impurity atoms therein. In this case, the other source/drain region that constitutes the charge transfer transistor 36 is the N-type impurity region (27, 28). In addition, other transistors that are not shown in the figure (a reset transistor, an amplifier transistor, a select transistor, and the like) are formed in parallel to the charge transfer transistor 36, whereby a condition in which electric charge can be transferred is obtained. It should be noted that FIG. 6A shows a plan view of the pixel, FIG. 6B shows a cross-sectional view taken along line A-A' in FIG. 6A, and FIG. 6C shows a cross-sectional view taken along line B-B' in FIG. 6A.

[Modified Example of the Method of Manufacturing the Solid-State Imaging Device]

Figure 7A:
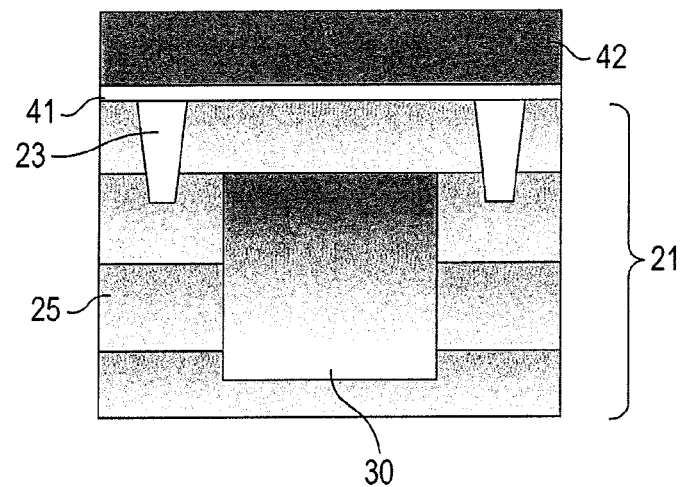
FIGS. 7A to 7C are views (no. 1) for illustrating a modified example of the manufacturing method of a solid-state imaging device according to the first embodiment of the invention.

It is also possible to employ the following manufacturing method of the solid-state imaging device according to the first embodiment of the invention. First, the element-isolating regions 23, the P− region 25, and the N-type impurity region 30 are formed in the semiconductor substrate 21 in the same manner as described above. Thereafter, as shown in FIG. 7A, an oxide film 41 and a photoresist film 42 are formed in such a condition as to be stacked on the semiconductor substrate 21 in that order. The film thickness of the oxide film 41 is set at, for example, about 10 nm.

Figure 7B:
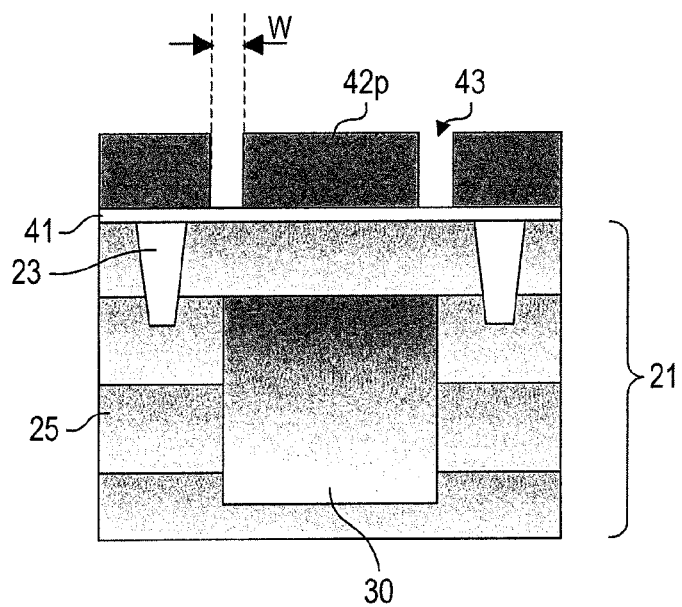

Next, as shown in FIG. 7B, the photoresist film 42 is patterned by a photolithography technique so that slits 43 are formed at positions sandwiching the region in which the N− region 27 should be formed, at a width W of, for example, about 10 to about 100 nm. Thereby, a resist pattern 42p that is separated at portions of the slits 43 is obtained.

Figure 7C:
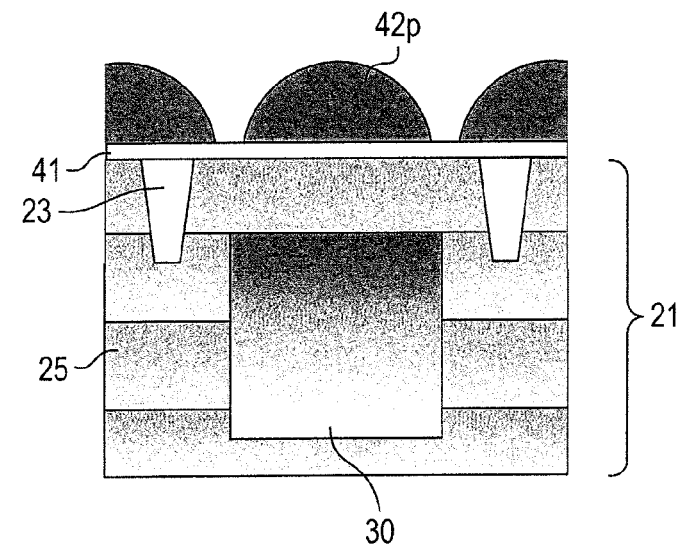

Next, as shown in FIG. 7C, the resist pattern 42p is thermally deformed by a thermal flow process. Thereby, the resist pattern 42p deformed in a hemispherical cross-sectional shape can be obtained. The method and the process conditions of the thermal flow process are as described above.

Figure 8A:
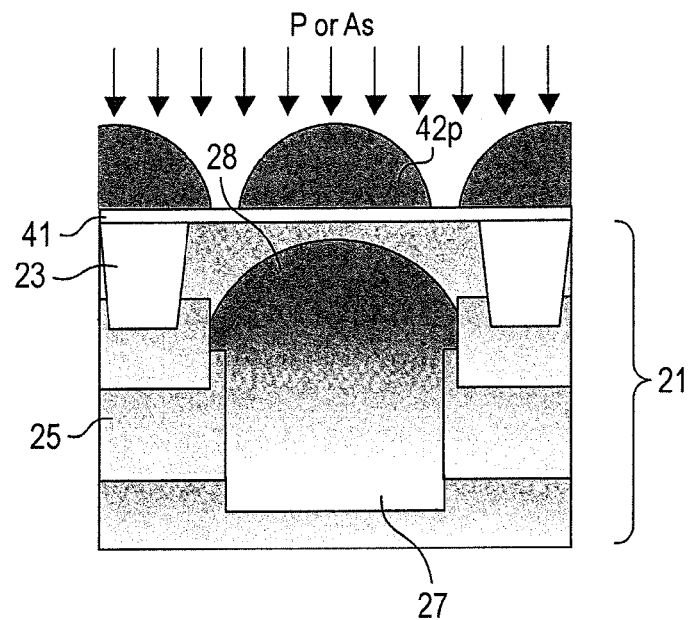
FIGS. 8A to 8C are views (no. 2) for illustrating a modified example of the manufacturing method of a solid-state imaging device according to the first embodiment of the invention.

Next, as shown in FIG. 8A, using the resist pattern 42p as a mask, N-type impurity atoms such as represented by P (phosphorus) and As (arsenic) are implanted into the silicon of the semiconductor substrate 21 by an ion implantation technique. As a result, N-type impurity regions including the N− region 27 and the N+ region 28 are formed inside the semiconductor substrate 21. At this time, the N+ region 28 is formed below the resist pattern 42p in such a form that the shape of the resist pattern 42p is reflected. The reason is that the implantation depths of the N-type impurity atoms ion-implanted through the resist pattern 42p are dependent on the thicknesses of the resist pattern 42p that follow the protruding shape. Accordingly, the N+ region 28 is formed into a protruding shape projecting toward the surface side of the semiconductor substrate 21.

Figure 8B:
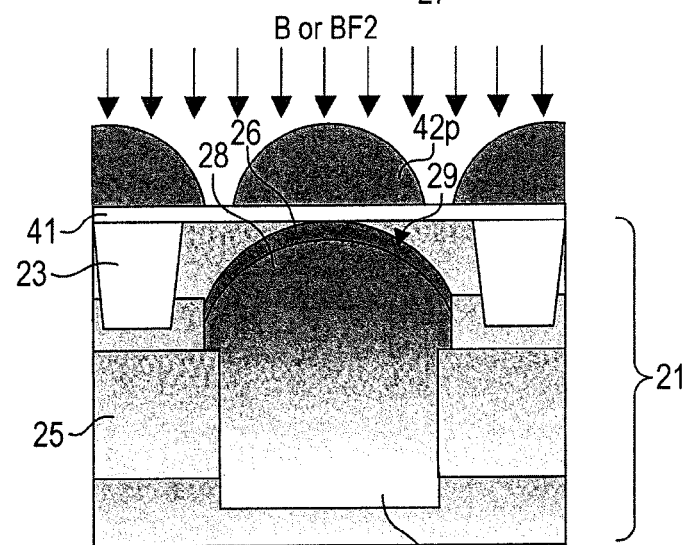

Next, as shown in FIG. 8B, using the resist pattern 42p as a mask, P-type impurity atoms such as represented by B (boron) and $BF_2$ are implanted into the silicon of the semiconductor substrate 21 by an ion implantation technique. As a result, the P+ region 26 is formed inside the semiconductor substrate 21. At this time, the P+ region 26 is formed below the resist pattern 42p in such a form that the shape of the resist pattern 42p is reflected, for the same reason as stated above. Accordingly, the P+ region 26 is formed into a protruding shape projecting toward the surface side of the semiconductor substrate 21, like the N+ region 28. The P+ region 26 is formed in a layer above the N+ region 28 in such a condition that it is in contact with the N+ region 28. The junction portion therebetween is formed as the PN junction portion 29 in a protruding shape.

It should be noted, as mentioned previously, that either one of the N+ region 28 and the P+ region 26 may be formed first. The N-type impurity atoms are not limited to P and As, but may be other impurity atoms. Likewise, the P-type impurity atoms are not limited to B and $BF_2$, but may be other impurity atoms. However, as for the acceleration energy in the ion implantation, it is necessary to join the P+ region 26 and the N+ region 28, the P+ region 26 being an upper layer and the N+ region 28 being a lower layer. Therefore, it is desirable that the acceleration energy should be set at an energy level such that the difference between the implantation depth of the P-type impurity atoms and the implantation depth of the N-type impurity atoms becomes from about 0 nm to about 50 nm, for example.

Figure 8C:
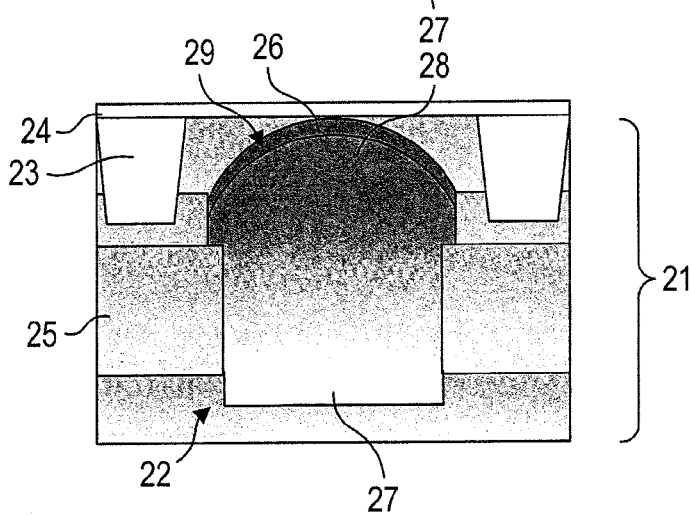

Next, as shown in FIG. 8C, the resist pattern 42p is removed by, for example, wet etching. At this time, the oxide film 41 covering the surface of the semiconductor substrate 21 is also removed. Thereafter, the insulating film 24 is formed over the surface (entire surface) of the semiconductor substrate 21 by a thermal oxidation technique. The following steps are the same as those in the manufacturing method described previously, so the explanation thereof is omitted.

In the solid-state imaging device according to the first embodiment the invention, the PN junction portion 29 at which the P-type impurity region (the P+ region 26) and the N-type impurity region (the N+ region 28), which form the photodiode 22, are in contact with each other is formed so as to have a protruding shape projecting toward the surface side of the semiconductor substrate 21. As a result, the area of the PN junction portion 29 extends not only along the substrate surface direction of the semiconductor substrate 21 but also in a substrate depth direction because of the three-dimensional slope of the protruding shape. Therefore, the effective PN junction area of the photodiode 22 can be enlarged and the PN junction capacitance can be increased in comparison with the case where the PN junction portion is formed in a shape without protruding. As a result, the saturated signal charge amount can be increased without enlarging the area of the photodiode that serves as the photoelectric conversion element two-dimensionally or increasing the impurity concentration.

Moreover, the photodiode can be formed so that the peak position of the impurity concentration of the N-type impurity region and the peak position of the impurity concentration of the P-type impurity region are in parallel. Therefore, the entire surface of the PN junction portion 29, which sticks out three-dimensionally, contribute to an increase of the PN junction capacitance by the impurity concentration gradient along the depth direction. Thus, the PN junction capacitance can be increased effectively.

Furthermore, of the P-type impurity regions including the P− region 25 and the P+ region 26, the P+ region 26 that has a relatively high impurity concentration is formed in such a condition as to be in contact with the N-type impurity region. As a result, signal charge can be stored in the PN junction portion 29 in a greater amount.

In addition, of the N-type impurity regions including the N− region 27 and the N+ region 28, the N+ region 28 that has a relatively high impurity concentration is formed in such a condition as to be in contact with the P-type impurity region. As a result, signal charge can be stored in the PN junction portion 29 in a greater amount. Moreover, a further increase in the amount of stored electric charge can be achieved by forming the PN junction portion 29 by joining the high-concentration impurity regions (26, 28) to each other. In addition, the signal charge generated by the photoelectric conversion can be collected in the PN junction portion 29, and therefore, the signal charge can be taken out more easily.

Figure 9:
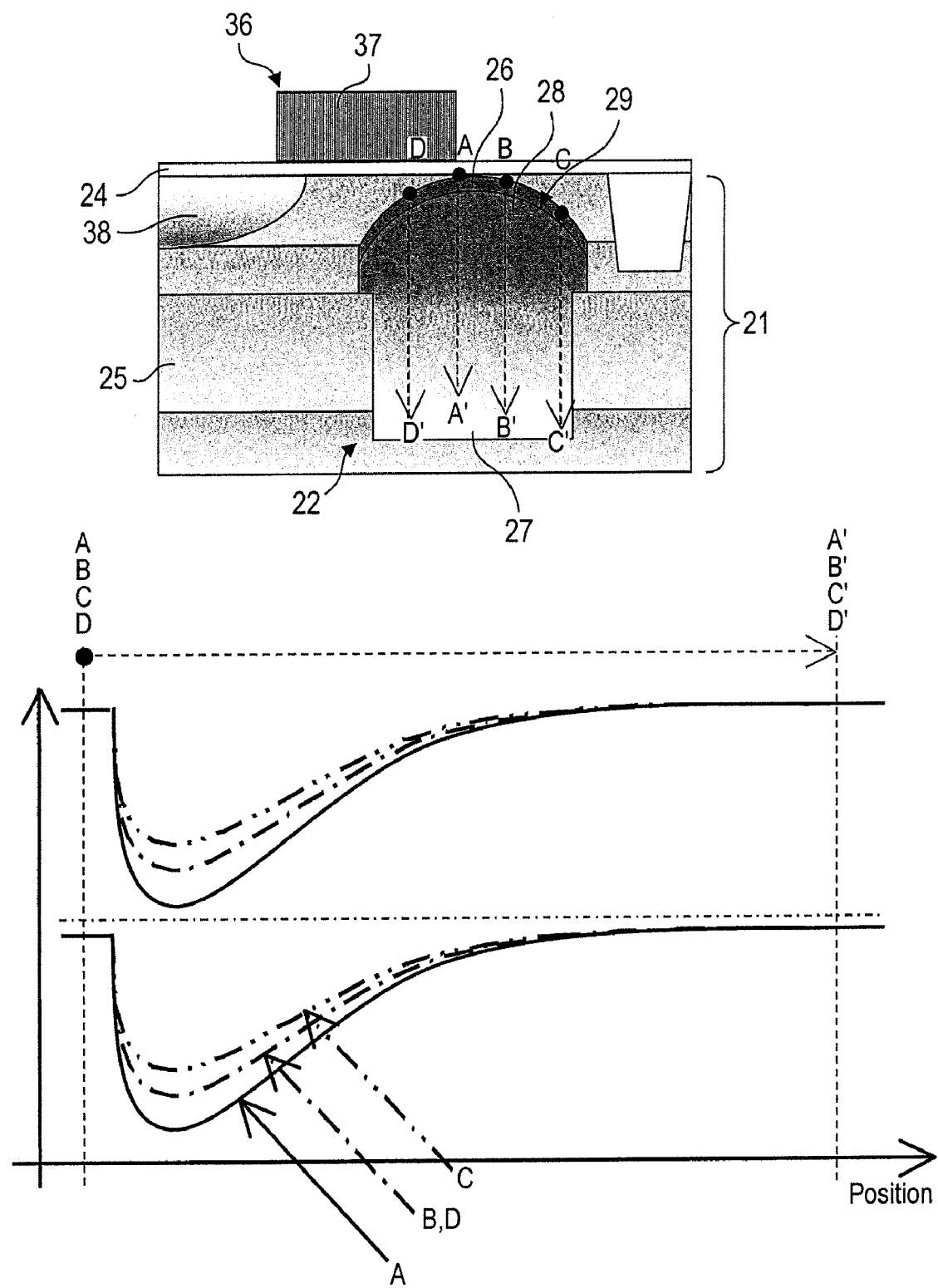
FIG. 9 is a potential graph along a substrate depth direction.
Figure 10:
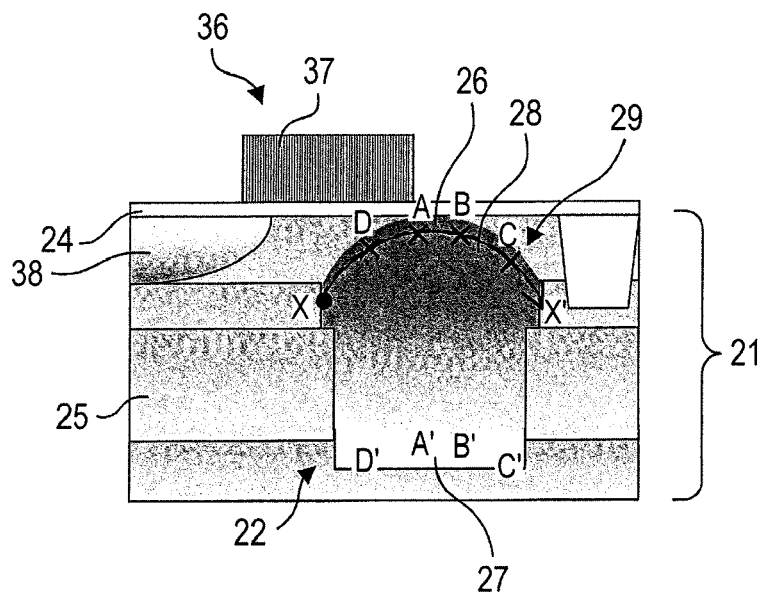
FIG. 10 is a potential graph on a line along the protruding shape of a PN junction portion.
Figure 10:
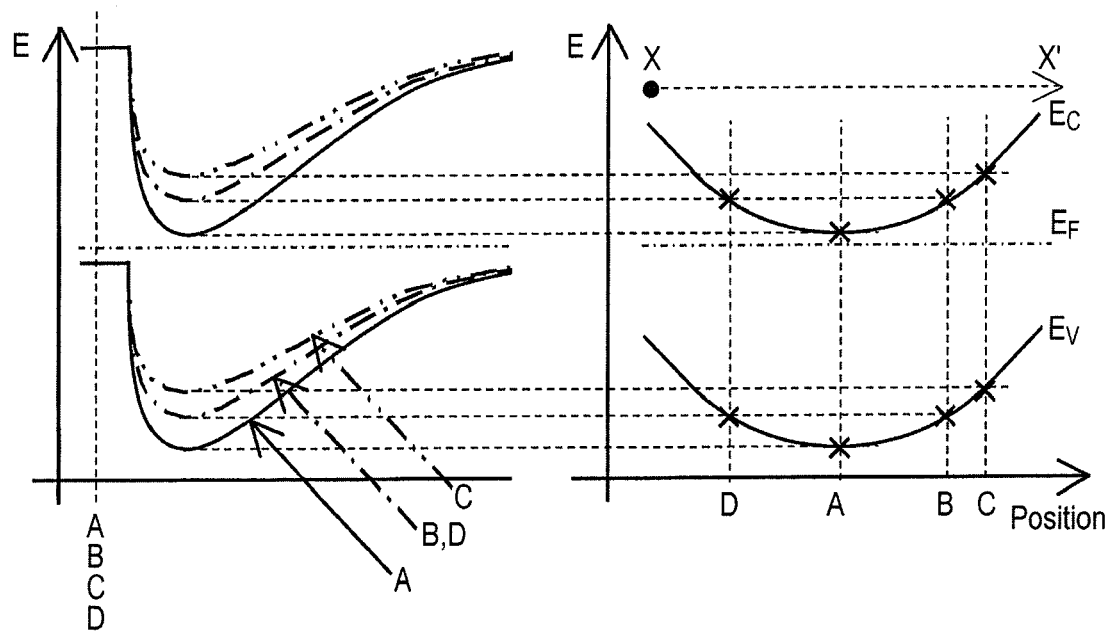

Furthermore, as shown in the potential graphs of FIGS. 9 and 10, the signal charge stored in the PN junction portion 29 can be taken out easily if the configuration in which the potential of the PN junction portion 29 having a protruding shape slopes toward the transfer gate 37. It should be noted that FIG. 9 shows a potential graph along a depth direction of the semiconductor substrate 21 and that FIG. 10 shows a potential graph on the line X-X' along the protruding shape (arc) of the PN junction portion 29.

[First Modified Example of the Solid-State Imaging Device]

Figure 11A:
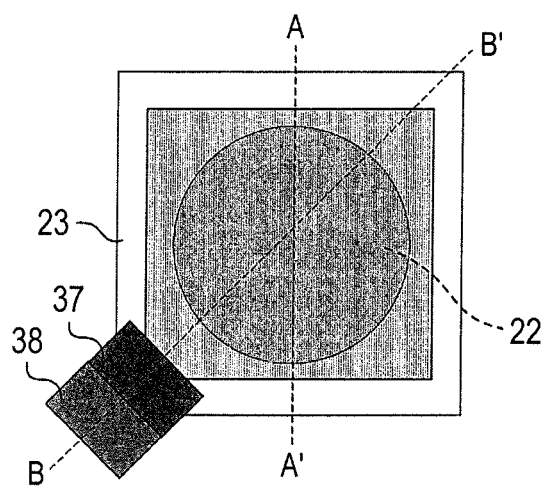
FIGS. 11A to 11D are views for illustrating a first modified example of the solid-state imaging device according to the first embodiment of the invention.
Figure 11B:
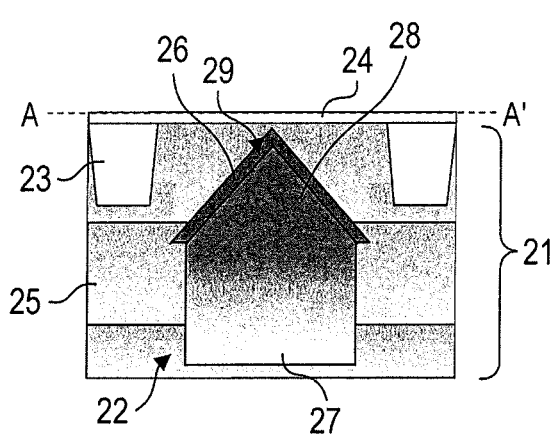
Figure 11C:
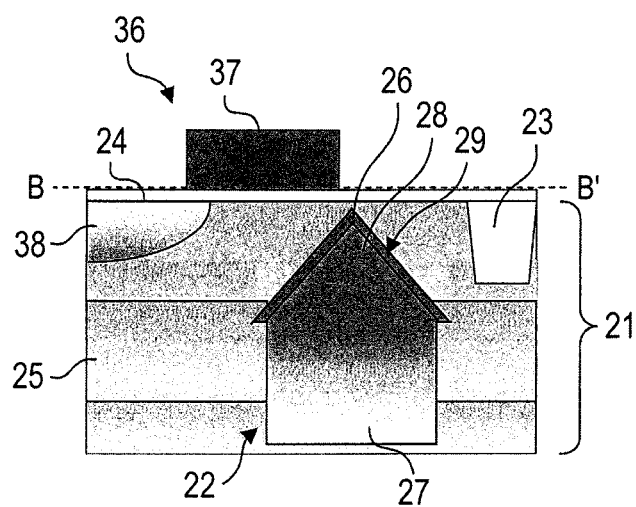
Figure 11D:
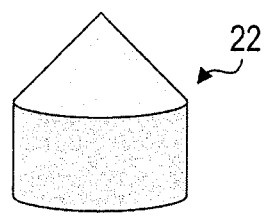

FIGS. 11A to 11D are views for illustrating a first modified example of the solid-state imaging device according to the first embodiment of the invention. FIG. 11A is a plan view of a pixel. FIG. 11B is a cross-sectional view taken along line A-A' of FIG. 11A. FIG. 11C is a cross-sectional view taking along line B-B' of FIG. 11A. FIG. 11D is a perspective view of the photodiode. In this first modified example, the PN junction portion 29 that constitutes a part of the photodiode 22 inside the semiconductor substrate 21 is formed in a conical protruding shape.

[Second Modified Example of the Solid-State Imaging Device]

Figure 12A:
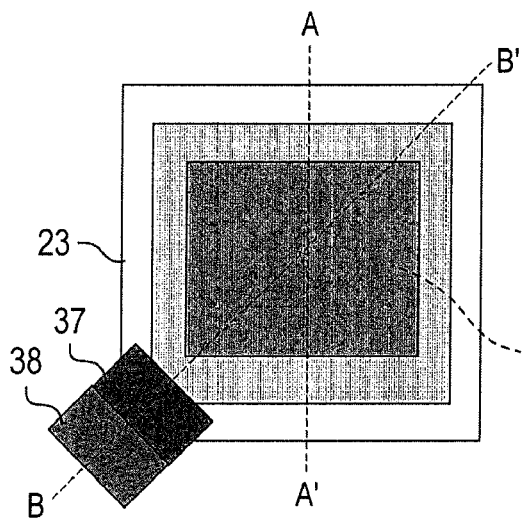
FIGS. 12A to 12D are views for illustrating a second modified example of the solid-state imaging device according to the first embodiment of the invention.
Figure 12B:
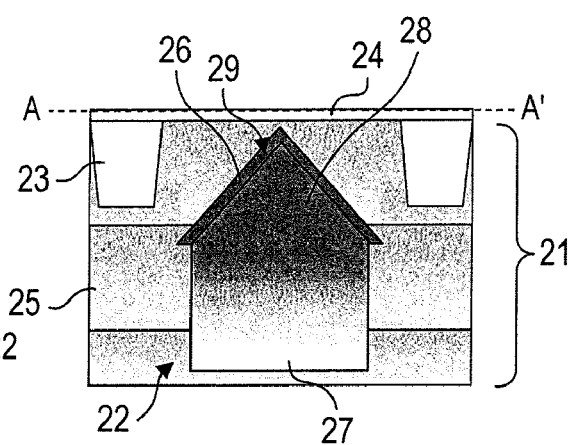
Figure 12C:
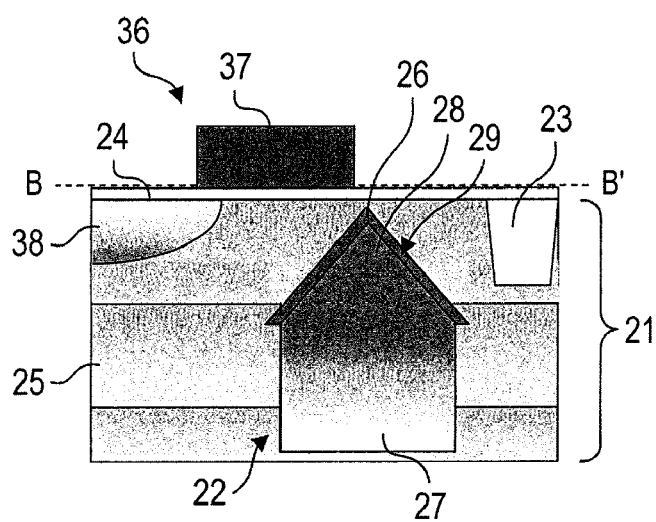
Figure 12D:
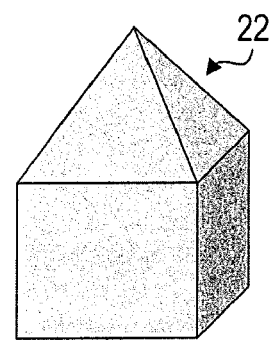

FIGS. 12A to 12D are views for illustrating a second modified example of the solid-state imaging device according to the first embodiment of the invention. FIG. 12A is a plan view of a pixel. FIG. 12B is a cross-sectional view taken along line A-A' of FIG. 12A. FIG. 12C is a cross-sectional view taking along line B-B' of FIG. 12A. FIG. 12D is a perspective view of the photodiode. In this second modified example, the PN junction portion 29 that constitutes a part of the photodiode inside the semiconductor substrate 21 is formed in a quadrangular pyramidal protruding shape. It should be noted that the protruding shape of the PN junction portion 29 may be any other pyramidal shape than the quadrangular pyramidal shape. Moreover, it is possible that the ridge line parts of the pyramid may be rounded.

[Application Example of the Solid-State Imaging Device]

Figure 13A:
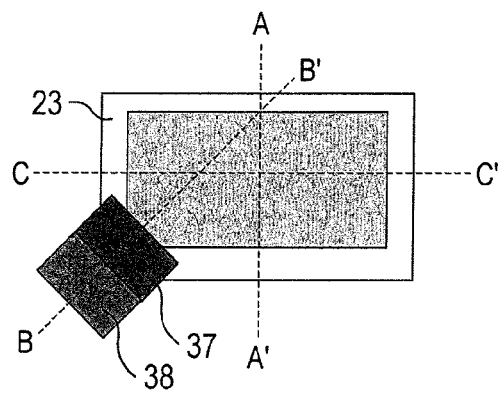
FIGS. 13A to 13C are views for illustrating an application example of the solid-state imaging device according to the first embodiment of the invention.
Figure 13B:
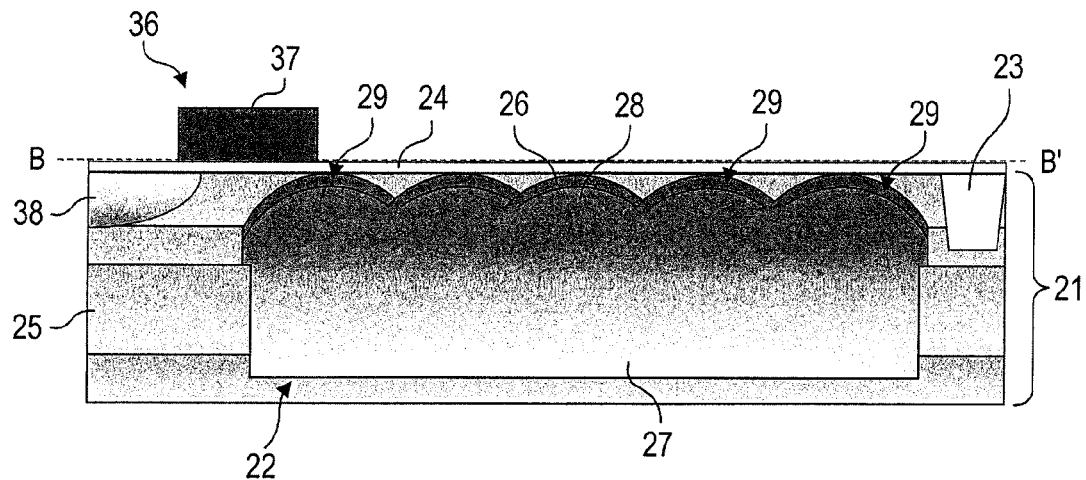
Figure 13C:
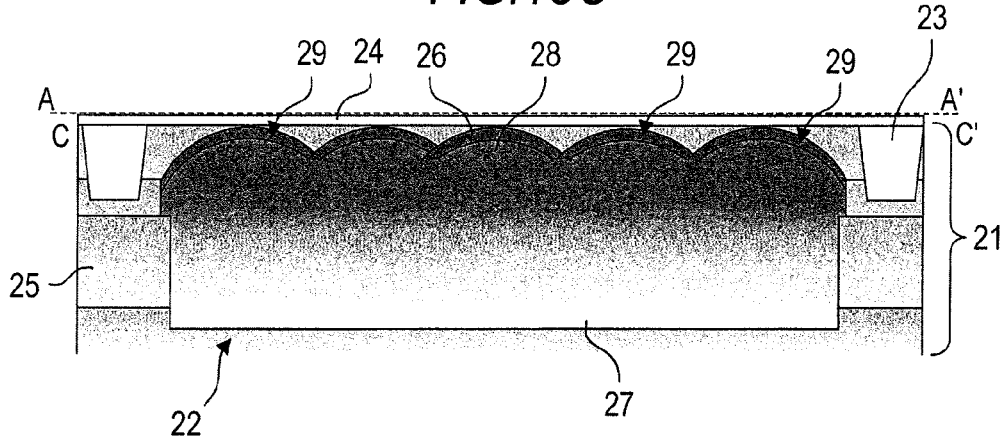

FIGS. 13A to 13C are views for illustrating an application example of the solid-state imaging device according to the first embodiment of the invention. FIG. 13A is a plan view, FIG. 13B is a cross-sectional view taken along line B-B' of FIG. 13A, and FIG. 13C is a cross-sectional view taking along line A-A' of FIG. 13A. It should be noted that the cross-sectional view taken along line C-C' of FIG. 13A is basically the same as the cross-sectional view taken along line A-A', although the distances between the element-isolating regions 23 for partitioning the unit pixel region are different. In this application example, a plurality of the PN junction portions 29 formed in a protruding shape are formed within a unit pixel region inside the semiconductor substrate 21. These plurality of the PN junction portions 29 are formed continuously in a substrate surface direction (i.e., in an adjacent positional relationship to one another). A plurality of the PN junction portions 29 that are formed in a protruding shape are formed within a pixel region of the semiconductor substrate 21 in this way. Thereby, a wide effective PN junction area of the photodiode 22 can be ensured in comparison with the case where a PN junction portion 29 is formed in a protruding shape within the pixel region.

3. Second Embodiment

[Configuration of the Solid-State Imaging Device]

Figure 14A:
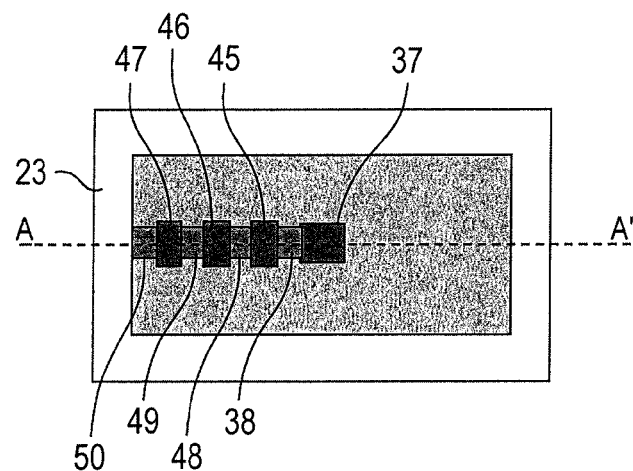
FIGS. 14A and 14B are examples of the configuration of a solid-state imaging device according to a second embodiment of the invention.
Figure 14B:
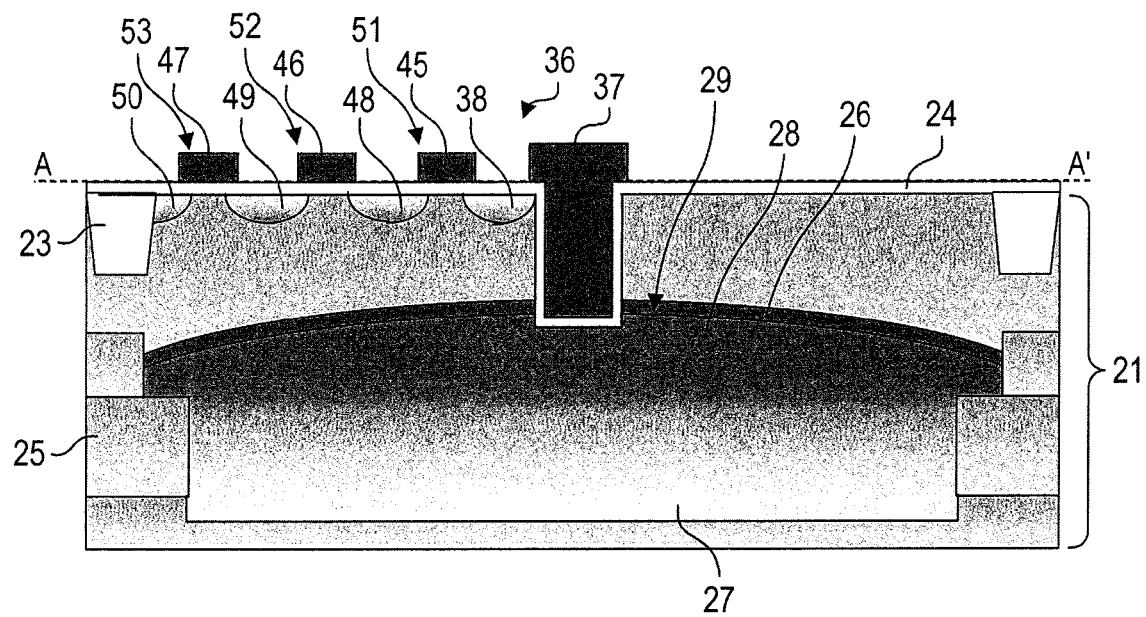

FIGS. 14A and 14B are examples of the configuration of a solid-state imaging device according to a second embodiment of the invention. FIG. 14A is a plan view of a pixel, and FIG. 14B is a cross-sectional view taken along line A-A' of FIG. 13A. Referring to FIGS. 14A and 14B, the PN junction portion 29 having the foregoing protruding shape is formed within a unit pixel region partitioned by the element-isolating regions 23, and the transfer gate 37 is formed at a position corresponding to the apex portion of the PN junction portion 29 (i.e., the highest protruding region). The transfer gate 37 is formed in a vertical structure extending in a depth direction from the surface of the semiconductor substrate 21. The PN junction portion 29 is formed at a necessary depth from the surface of the semiconductor substrate 21. It is desirable that the depth position at which the PN junction portion 29 is to be formed should be a depth of, for example, 0.3 μm or greater from the surface of the semiconductor substrate 21 so that the signal charge stored in the PN junction portion 29 does not cause adverse effects on the operations of the pixel transistors.

The transfer gate 37 is as follows. For example, a recessed groove portion that reaches the PN junction portion 29 is formed in the surface of the semiconductor substrate 21, and thereafter the surface of the semiconductor substrate 21 including the recessed surface is covered by the insulating film 24. Thereafter, the groove portion is buried by an electrode material such as polysilicon so as to be formed in a columnar shape. Accordingly, The upper end portion of the transfer gate 37 is formed so as to protrude from the surface of the semiconductor substrate 21, like the other gates 45, 46, and 47. The lower end portion of the transfer gate 37 is formed so as to connect with the apex portion of the PN junction portion 29.

It should be noted that, from the viewpoint of reading the signal charge stored in the PN junction portion 29, the lower end portion of the transfer gate 37 is not necessarily connected to the PN junction portion 29 but, for example, may be disposed in the vicinity of the PN junction portion 29. However, in order to efficiently read the signal charge stored in the PN junction portion 29, it is preferable to employ a configuration in which the lower end portion of the transfer gate 37 is connected at the PN junction portion 29. For the same reason, it is desirable that the transfer gate 37 should be formed at a position corresponding to the apex portion of the PN junction portion 29 within the substrate surface. Therefore, the second embodiment of the invention employs a configuration in which the lower end portion of the transfer gate 37 having a vertical structure is connected to the apex portion of the PN junction portion 29.

The gates 45, 46, and 47 are formed within a unit pixel region (a region partitioned by the element-isolating regions 23) and using an electrode material such as polysilicon. These gates 45, 46, and 47 form transistors other than the charge transfer transistor 36. Specifically, the gate 45, together with the source/drain region 38 and a source/drain region 48, constitutes a transistor 51 that forms a pixel transistor. The gate 46, together with the source/drain region 48 and a source/drain region 49, constitutes a transistor 52 that forms a pixel transistor. The gate 47, together with the source/drain region 49 and a source/drain region 50, constitutes a transistor 53 that forms a pixel transistor.

The gates 45, 46, and 47 are formed at a predetermined interval in a row from the center portion of the unit pixel region toward the perimeter portion (in the condition in which the source/drain regions are interposed therebetween). On the other hand, the photodiode 22, including the PN junction portion 29 serving as the electric charge storing region, is formed below the portion in which transistors 36, 51, 52, and 53 are formed, so that it overlaps with the transistors 36, 51, 52, and 53 two-dimensionally. In addition, the center portion of the photodiode 22 exists at the same position as the center portion of the rectangular unit pixel region that is partitioned by the element-isolating regions 23. The photodiode 22 is formed so as to be wide from one end of the unit pixel region to the other end along a longer direction of the unit pixel region, and the transistors 36, 51, 52, and 53 are formed within the region in which the photodiode 22 is formed. Although not shown in the figure, the photodiode 22 is formed so as to be wide from the vicinity of one end of the unit pixel region to the vicinity of the other end along a shorter direction of the unit pixel region, and the transistors 36, 51, 52, and 53 are formed within the region in which the photodiode 22 is formed.

The solid-state imaging device according to the second embodiment of the invention provides such advantageous effects as follows, in addition to the same advantageous effects as in the first embodiment. That is, the PN junction portion 29 can be formed at a deeper position from the surface of the semiconductor substrate 21 by employing the vertical structure transfer gate 37. As a result, the region in which the photodiode 22 is formed can be widened to the entire unit pixel region including the area below the transistors 36, 51, 52, and 53. Therefore, the effective PN junction area of the photodiode 22 can be enlarged further and the PN junction capacitance can be increased in comparison with the foregoing first embodiment. As a result, the saturated signal charge amount can be increased compared to the case with the same field of view.

Moreover, the signal charge stored in the PN junction portion 29 can be read out more easily by forming the transfer gate 37 at the position corresponding to the apex portion of the PN junction portion 29 within a unit pixel region partitioned by the element-isolating regions 23. In particular, when the PN junction portion 29 is formed in a conical or pyramidal protruding shape and the transfer gate 37 is formed at a position corresponding to the apex portion as in FIGS. 11A to 11D and FIGS. 12A to 12D, the signal charge can be read out even more easily. Also, in the case where the PN junction portion 29 is formed in a conical protruding shape and the transfer gate 37 is formed at a position corresponding to its apex portion, the distance between the portion at which the transfer gate 37 is formed and the perimeter portion of the PN junction portion 29 becomes equal in the substrate surface. As a result, remaining electric charge does not occur easily when reading the signal charge from the PN junction portion 29.

Although not shown in the figure, signal charge can be readout thoroughly from the PN junction portion 29 formed over the entire unit pixel region when a plurality of transfer gates (vertical structure gate) 37 are formed corresponding to the formation region of the PN junction portion 29 formed in a protruding shape within the unit pixel region. It is desirable that, when a plurality of the transfer gates 37 are formed within a unit pixel region, one of them should be formed at the position corresponding to the apex portion of the PN junction portion 29, as shown in FIGS. 14A and 14B. The reason is that, with the PN junction portion 29 having a protruding shape, it is most easy to take out signal charge from the apex portion.

4. Application Example

The solid-state imaging devices according to the foregoing embodiments are suitable for use as the imaging device (image input device) in imaging apparatus such as digital still cameras and video cameras.

Here, the imaging apparatus is one that contains a solid-state imaging device as an imaging device and an optical system, such as a lens group, for forming an image of the subject on a imaging surface (light receptive surface) of the solid-state imaging device. Specifically, for example, the imaging apparatus may refer to a camera module that is to be incorporated in an electronic device such as a mobile telephone, and a camera system such as a digital still camera or a video camera that incorporates the just-mentioned camera module.

Figure 15:
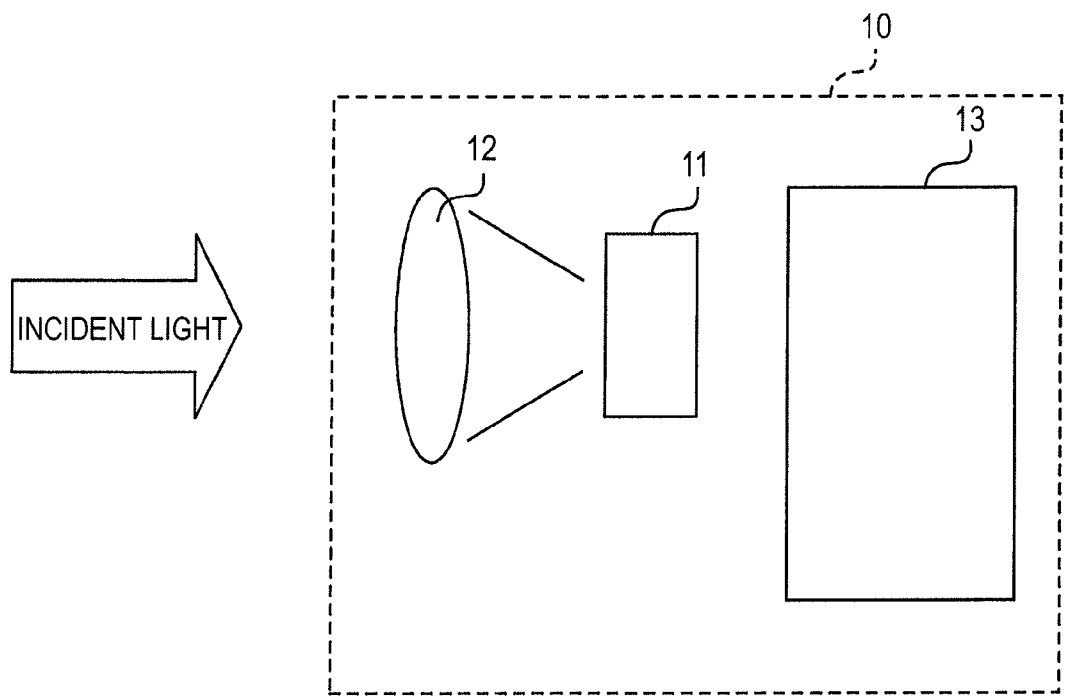
FIG. 15 is a block diagram showing an example of the configuration of an imaging apparatus to which the invention is applied.
Figure 16:
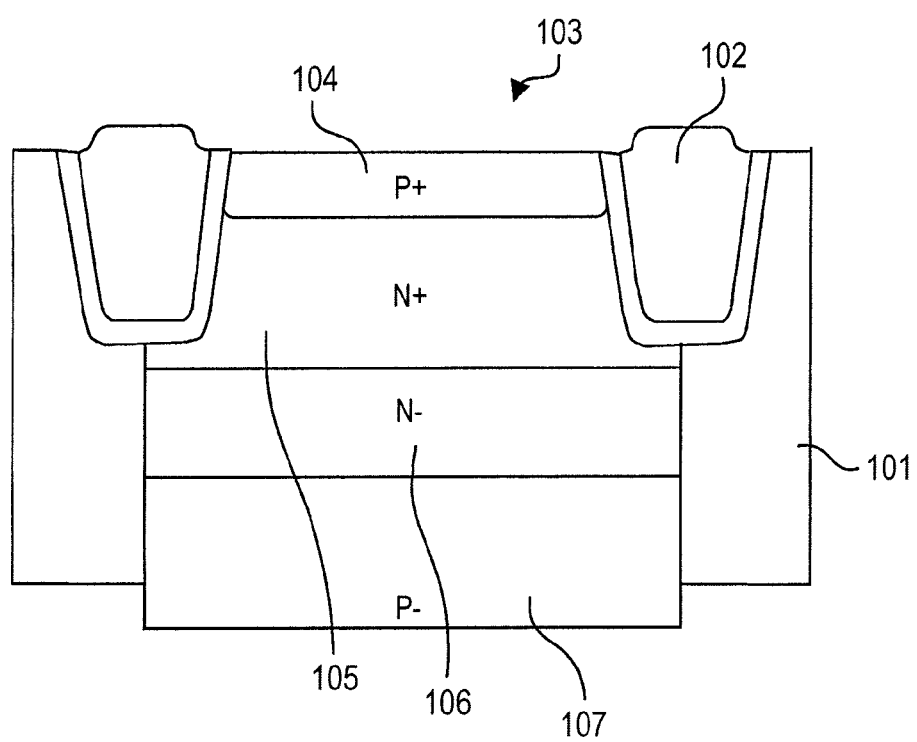
FIG. 16 is a cross-sectional view showing an example of the structure of a photodiode.

FIG. 15 is a block diagram showing an example of the configuration of an imaging apparatus to which the invention is applied. An imaging apparatus 10 according to this example includes a solid-state imaging device 11 that is the imaging device, an optical system 12 (such as a lens group) for guiding the light from the subject to the solid-state imaging device 11, and a signal processing unit 13 for processing pixel signal that is output from the solid-state imaging device 11. In this imaging apparatus 10, the solid-state imaging device 11 may be formed in the form of a single chip, or it may be in the form of module having an imaging function in which the solid-state imaging device 11 is packaged together with the signal processing unit 13 or the optical system 12.

The present application contains subject matter related to that disclosed in Japanese Priority Patent Application JP 2008-272673 filed in the Japan Patent Office on Oct. 23, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor substrate; and
   a plurality of pixels arrayed two-dimensionally in the semiconductor substrate,
   each of the pixels having a photoelectric conversion element that performs photoelectric conversion,
   the photoelectric conversion element having
   a first impurity region, formed in the semiconductor substrate, containing an impurity of a first conductivity type;
   a second impurity region formed in the semiconductor substrate so as to be in contact with the first impurity region, containing an impurity of a second conductivity type different from the first conductivity type; and
   a PN junction portion in which the first impurity region and the second impurity region are in contact with each other, formed in a protruding shape projecting toward a surface side of the semiconductor substrate, and further wherein the PN junction portion extends from an apex located at a planar top surface of the semiconductor substrate to opposed isolation portions and wherein the PN junction portion extends to a depth that is more than half a greatest depth of the isolation portions at outermost regions of the PN junction portion thereof and the outermost regions of the PN junction portion are located beneath the planar top surface of the semiconductor substrate that is located between the opposed isolation regions.

2. The solid-state imaging device as set forth in claim 1, wherein the PN junction portion is formed in a hemisphere protruding shape.

3. The solid-state imaging device as set forth in claim 1, wherein the PN junction portion is formed in a conical protruding shape.

4. The solid-state imaging device as set forth in claim 1, wherein the PN junction portion is formed in a pyramidal protruding shape.

5. The solid-state imaging device as set forth in claim 1, wherein the first impurity region includes a low-concentration impurity region having a relatively low impurity concentration and a high-concentration impurity region having a relatively high impurity concentration, and the high-concentration impurity region is formed in such a condition as to be in contact with the second impurity region.

6. The solid-state imaging device as set forth in claim 1 or 5, wherein the second impurity region includes a low-concentration impurity region having a relatively low impurity concentration and a high-concentration impurity region having a relatively high impurity concentration, and the high-concentration impurity region is formed in such a condition as to be in contact with the first impurity region.

7. The solid-state imaging device as set forth in claim 1, wherein
   each of the pixels has a pixel transistor configured to read a signal charge from the photoelectric conversion element;
   the pixel transistor includes a charge transfer transistor having a transfer gate.

8. The solid-state imaging device as set forth in claim 1, wherein a plurality of the PN junction portions each formed in the protruding shape are formed within each of the pixels.

9. The solid-state imaging device as set forth in claim 1, wherein
   each of the pixels has a pixel transistor configured to read a signal charge from the photoelectric conversion element;
   the pixel transistor includes a charge transfer transistor having a transfer gate; and
   the transfer gate is formed in a vertical structure extending in a depth direction from a surface of the semiconductor substrate.

10. The solid-state imaging device as set forth in claim 9, wherein the transfer gate is formed within a unit pixel region at a position corresponding to the apex of the PN junction portion formed in the protruding shape.

11. The solid-state imaging device as set forth in claim 9, wherein a plurality of the transfer gates are formed within a unit pixel region at positions corresponding to a region in which the PN junction portion formed in a protruding shape is formed.

12. A method of manufacturing a solid-state imaging device having a photoelectric conversion element formed within a pixel region in a semiconductor substrate, comprising the steps of:
    forming a first impurity region by introducing a first conductivity type impurity into the semiconductor substrate; and
    forming a second impurity region in such a condition as to be in contact with the first impurity region by introducing an impurity of a second conductivity type that is different from the first conductivity type, wherein
    in the respective steps, the first impurity region and the second impurity region are formed so that a PN junction portion in which the first impurity region and the second impurity region are in contact with each other has a protruding shape toward a surface side of the semiconductor substrate, and further wherein the PN junction portion extends from an apex located at a planar top surface of the semiconductor substrate to opposed isolation portions and wherein the PN junction portion extends to a depth that is more than half a greatest depth of the isolation portions at outermost regions of the PN junction portion thereof and the outermost regions of the PN junction portion are located beneath the planar top surface of the semiconductor substrate that is located between the opposed isolation regions.

13. An imaging apparatus comprising:
    a solid-state image sensing device; and
    an optical system configured to guide light from a subject to the solid-state image sensing device,
    the solid-state image sensing device including a semiconductor substrate; and
    a plurality of pixels arrayed two-dimensionally in the semiconductor substrate,
    each of the pixels having a photoelectric conversion element that performs photoelectric conversion,
    the photoelectric conversion element having
    a first impurity region, formed in the semiconductor substrate, containing an impurity of a first conductivity type;
    a second impurity region formed in the semiconductor substrate so as to be in contact with the first impurity region, containing an impurity of a second conductivity type different from the first conductivity type; and
    a PN junction portion in which the first impurity region and the second impurity region are in contact with each other, formed in a protruding shape toward a surface side of the semiconductor substrate, and further wherein the PN junction portion extends from an apex located at a planar top surface of the semiconductor substrate to opposed isolation portions and wherein the PN junction portion extends to a depth that is more than half a greatest depth of the isolation portions at outermost regions of the PN junction portion thereof and the outermost regions of the PN junction portion are located beneath the planar top surface of the semiconductor substrate that is located between the opposed isolation regions.

* * * * *